United States Patent
Yoshihara et al.

(10) Patent No.: US 11,141,758 B2
(45) Date of Patent: Oct. 12, 2021

(54) FILM FORMING METHOD, STORAGE MEDIUM, AND FILM FORMING SYSTEM

(71) Applicant: Tokyo Electron Limited, Tokyo (JP)

(72) Inventors: Kentaro Yoshihara, Koshi (JP); Yuichi Yoshida, Koshi (JP); Naoki Shibata, Koshi (JP); Kousuke Yoshihara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/997,788

(22) Filed: Jun. 5, 2018

(65) Prior Publication Data

US 2018/0361428 A1  Dec. 20, 2018

(30) Foreign Application Priority Data

Jun. 19, 2017  (JP) .............................. JP2017-119627

(51) Int. Cl.
| | | |
|---|---|---|
| *B05D 3/10* | (2006.01) | |
| *B05D 3/06* | (2006.01) | |
| *B05D 1/00* | (2006.01) | |
| *B05C 5/00* | (2006.01) | |
| *H01L 51/00* | (2006.01) | |
| *H01L 21/027* | (2006.01) | |
| *H01L 21/3105* | (2006.01) | |

(52) U.S. Cl.
CPC .............. *B05D 3/107* (2013.01); *B05C 5/002* (2013.01); *B05D 1/005* (2013.01); *B05D 3/065* (2013.01); *H01L 21/0273* (2013.01); *H01L 21/31058* (2013.01); *H01L 51/00* (2013.01); *H01L 51/0018* (2013.01)

(58) Field of Classification Search
CPC ......... B05D 3/107; B05D 1/005; B05D 3/065
See application file for complete search history.

(56) References Cited

U.S. PATENT DOCUMENTS

| | | | | |
|---|---|---|---|---|
| 4,767,695 A | * | 8/1988 | Ong ....................... | G03F 7/0043 430/270.1 |
| 5,110,763 A | * | 5/1992 | Matsumoto ......... | H01L 21/3121 438/624 |
| 5,182,624 A | * | 1/1993 | Tran ................... | H01L 27/14643 257/40 |
| 5,204,288 A | * | 4/1993 | Marks ................. | H01L 21/3105 438/699 |

(Continued)

FOREIGN PATENT DOCUMENTS

| | | |
|---|---|---|
| JP | 60-054439 A | 3/1985 |
| JP | H09-167753 A | 6/1997 |

(Continued)

*Primary Examiner* — Dah-Wei D. Yuan
*Assistant Examiner* — Kristen A Dagenais-Englehart
(74) *Attorney, Agent, or Firm* — Posz Law Group, PLC

(57) ABSTRACT

A film forming method for forming a coating film by applying a coating solution onto a substrate having projections and recesses formed on a surface thereof by a predetermined pattern, includes: applying the coating solution onto the surface of the substrate to form a thick film having a depth of projections and recesses on a surface of the film of a predetermined value or less and having a film thickness larger than a target film thickness of the coating film; and removing the surface of the thick film to form the coating film having the target film thickness.

5 Claims, 16 Drawing Sheets

(56) References Cited

U.S. PATENT DOCUMENTS

| | | | | |
|---|---|---|---|---|
| 5,250,472 A | * | 10/1993 | Chen | H01L 21/76819 |
| | | | | 216/38 |
| 2006/0261434 A1 | * | 11/2006 | Lazovsky | H01L 21/02167 |
| | | | | 257/499 |
| 2009/0029525 A1 | * | 1/2009 | Ohnuma | H01L 21/76254 |
| | | | | 438/458 |
| 2011/0171586 A1 | * | 7/2011 | Hata | G03F 7/38 |
| | | | | 430/325 |
| 2012/0196424 A1 | * | 8/2012 | Krishnan | H01L 29/66181 |
| | | | | 438/387 |
| 2012/0275080 A1 | * | 11/2012 | Dunn | H01L 28/40 |
| | | | | 361/301.4 |
| 2013/0089664 A1 | * | 4/2013 | Inagaki | H01L 21/6715 |
| | | | | 427/240 |
| 2015/0357188 A1 | * | 12/2015 | Shimura | H01L 21/31055 |
| | | | | 438/5 |

FOREIGN PATENT DOCUMENTS

| | | |
|---|---|---|
| JP | 2000-357738 A | 12/2000 |
| JP | 2002-014477 A | 1/2002 |
| JP | 2008-243923 A | 10/2008 |
| JP | 2014-165252 A | 9/2014 |

* cited by examiner

FILM FORMING METHOD, STORAGE MEDIUM, AND FILM FORMING SYSTEM

CROSS REFERENCE TO RELATED APPLICATIONS

This application is based upon and claims the benefit of priority of the prior Japanese Patent Application No. 2017-119627, filed in Japan on Jun. 19, 2017, the entire contents of which are incorporated herein by reference.

BACKGROUND OF THE INVENTION

1. Field of the Invention

The present invention relates to a film forming method, a storage medium, and a film forming system for forming a coating film by applying a coating solution onto a substrate having projections and recesses formed on a surface thereof by a predetermined pattern.

2. Description of the Related Art

In a photolithography step in a manufacturing process of a semiconductor device in a multilayer structure, a coating treatment of applying a coating solution, for example, onto a semiconductor wafer (hereinafter, referred to as a "wafer") to form a resist film or the like, exposure processing of exposing the resist film to a predetermined pattern, a developing treatment of developing the exposed resist film and so on are performed in sequence to thereby form a predetermined resist pattern on the wafer. Using the resist pattern as a mask, an etching treatment for the wafer is performed, and then a removal treatment of the resist film and so on are performed to form a predetermined pattern on the wafer. The process of forming the predetermined pattern in a predetermined layer is repeatedly performed a plurality of times to manufacture the semiconductor device in a multilayer structure.

In the case where the predetermined pattern is repeatedly formed on the wafer as described above and a film thickness of a resist film and a pitch and a depth of projections and recesses formed by the pattern are on the nanometer order, in order to appropriately form a predetermined pattern in an (n+1)-th layer after a predetermined pattern is formed in an nth layer, a resist film for the (n+1)-th layer needs to be formed so that its surface becomes flat. Further, to this end, the face onto which the resist solution is applied needs to be flat.

Hence, conventionally, an organic film such as an SOC (Spin On Carbon) film, an SOG (Spin On Glass) film or the like is formed on the predetermined pattern on the wafer and a surface of the organic film, namely, the coating surface of the resist solution is made flatten (Japanese Patent Application Laid-open No. 2014-165252).

In a film forming system disclosed in Japanese Patent Application Laid-open No. 2014-165252, an organic material is applied onto the substrate having projections and recesses formed on a surface thereof by a predetermined pattern, then a thermal treatment is performed on the organic material to form an organic film on the substrate, and ultraviolet irradiation processing is performed on the organic film to remove the surface of the organic film until the surface of a projecting portion of the projections and recesses is exposed. Thereafter, applying the organic material or the like again flattens the surface of the organic film.

SUMMARY OF THE INVENTION

Incidentally, as the semiconductor device in a multilayer structure, a semiconductor device in a three-dimensional staked structure such as a 3D-NAND flash memory is brought into a commercial stage in recent years. As illustrated in FIG. 17, on a wafer W in the manufacturing process of the 3D-NAND semiconductor device, projections and recesses are formed on the surface by a predetermined pattern, and more specifically, a projecting portion M in a shape of n steps is formed on the surface by a predetermined pattern. Further, the pitch (concretely, a width D of a recessed portion N) and the width of the projecting portion M of the projections and recesses formed on the wafer W are on the order of several hundred micrometers, and a depth H of the projections and recesses is on the order of several micrometers.

In other words, the wafer W relating to manufacture of the 3D-NAND semiconductor device is formed with projections and recesses in which the projecting portion M and the recessed portion N are large in width and the recessed portion N is low in aspect ratio. In the manufacturing process of the 3D-NAND semiconductor device, at the time when forming a predetermined pattern in the recessed portion N in order to form the (n+1)-th layer after the projecting portion M in the shape of n steps is formed, a resist film R is formed on the surface of the wafer W, and exposure and so on are performed on the resist film R on the recessed portion N on the surface of the wafer W. The film thickness of the resist film to the wafer W formed with the projections and recesses having the pitch and depth on the above-described orders is preferably several micrometers.

However, if the resist film R having a film thickness of several micrometers is formed by spin coating on the surface with the projections and recesses having the pitch and depth on the above-described high orders, not only projections and recesses appear on the surface of the resist film R but the following problem arises. Specifically, the large projections and recesses on the order of several micrometers become a barrier to make it hard for the resist solution to spread outward in spin coating, thus causing the film thickness of the resist film R to gradually decrease from a central portion to an outer periphery of the wafer W, in other words, the film thickness of the resist film R becomes nonuniform in the diameter direction of the wafer W. Then, the CD (Critical Dimension) of a pattern to be formed on the recessed portion N of the wafer W becomes nonuniform within the plane of the wafer W.

Using the technique disclosed in Japanese Patent Application Laid-open No. 2014-165252 can reduce the projections and recesses on the surface of the resist film R but cannot improve the uniformity of the film thickness of the resist film R. Further, in the case where the projections and recesses on the orders as those on the wafer W in the manufacturing process of the 3D-NAND semiconductor device are formed on the wafer surface, the CD of the pattern to be formed on the recessed portion N of the wafer W is more affected by in-plane nonuniformity of the film thickness of the resist film than by the projections and recesses on the surface of the resist film R on the wafer W.

Note that also in the case of the wafer W with the projections and recesses having the pitch and depth on the above-described high orders on the surface, the resist film R having a uniform film thickness can be obtained if the rotation speed is decreased down to, for example, 10 to 50 rpm in spin coating of the resist solution. However, if the rotation speed is decreased down to such a low rotation speed, the throughput decreases to affect productivity.

The present invention has been made in consideration of the above circumstances. An object of this disclosure is to form a coating film high in in-plane uniformity of film thickness without decreasing productivity in a film forming method and a film forming system for forming a coating film on a substrate having projections and recesses formed on a surface by a predetermined pattern.

One aspect of the technique according to this disclosure is a film forming method for forming a coating film by applying a coating solution onto a substrate having projections and recesses formed on a surface thereof by a predetermined pattern, the film forming method including: applying the coating solution onto the surface of the substrate to form a thick film having a depth of projections and recesses on a surface of the film of a predetermined value or less and having a film thickness larger than a target film thickness of the coating film; and removing the surface of the thick film to form the coating film having the target film thickness.

One aspect of the technique according to this disclosure in another viewpoint is a computer-readable storage medium storing a program running on a computer of a control unit controlling a film forming system to cause the film forming system to execute the above-described film forming method.

One aspect of the technique according to this disclosure in still another viewpoint is a film forming system for forming a coating film by applying a coating solution onto a substrate having projections and recesses formed on a surface thereof by a predetermined pattern, the film forming system including: a coating treatment apparatus which performs a coating treatment of the coating solution on the substrate to form the coating film; a surface treatment apparatus which performs a surface treatment of modifying a surface of the coating film; a developing treatment apparatus which performs a developing treatment on the coating film subjected to the surface treatment; and a control unit configured to control the coating treatment apparatus to form a thick film having a depth of projections and recesses on a surface of the film of a predetermined value or less and having a film thickness larger than a target film thickness of the coating film by the coating treatment, and control the surface treatment apparatus and the developing treatment apparatus to remove the surface of the thick film to form the coating film having the target film thickness by the surface treatment and the developing treatment.

According to one aspect of the technique according to this disclosure, it is possible to form a coating film high in in-plane uniformity on a substrate having projections and recesses formed on a surface without decreasing productivity. Therefore, the in-plane uniformity of CD of a pattern formed in a recessed portion of the wafer can be increased.

DETAILED DESCRIPTION OF THE INVENTION

The present inventors thought that in a case of a wafer in a manufacturing process of a 3D-NAND semiconductor device, the film thickness of a coating film/resist film becomes nonuniform within a plane because of a great influence of the centrifugal force applied on the coating solution at spin coating of a coating solution for forming the coating film. Therefore, the present inventors considered decreasing the rotation speed of the wafer at the spin coating.

Figure 1:
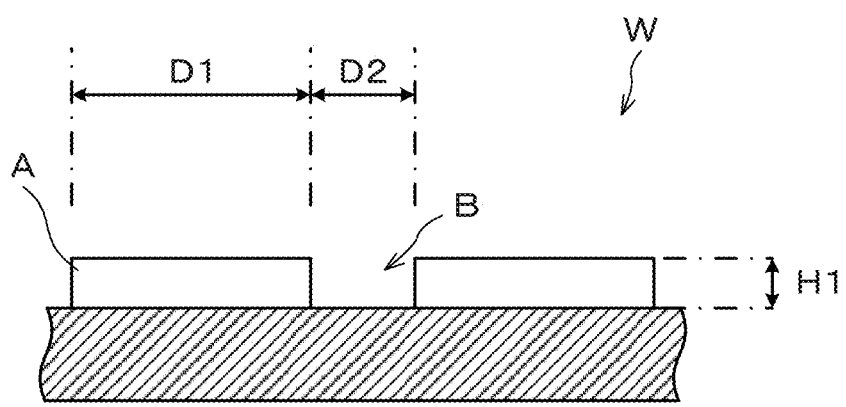
FIG. 1 is a view for explaining a wafer used for investigation.

Hence, as illustrated in FIG. 1, a resist film was formed on a wafer W having projections and recesses, in which a width D1 of a projecting portion A was 2800 μm, a width D2 of a recessed portion B was 200 μm, and a depth H of projections and recesses was 7.0 μm, formed on a surface, while the number of rotations at spin coating of a resist film R was changed, more specifically, the number of rotations at drying the resist film was changed. Then, the film thickness of the resist film R was measured at a plurality of positions. Note that the resist solution used is a MUV resist solution and its viscosity was 100 cP.

Figure 2:
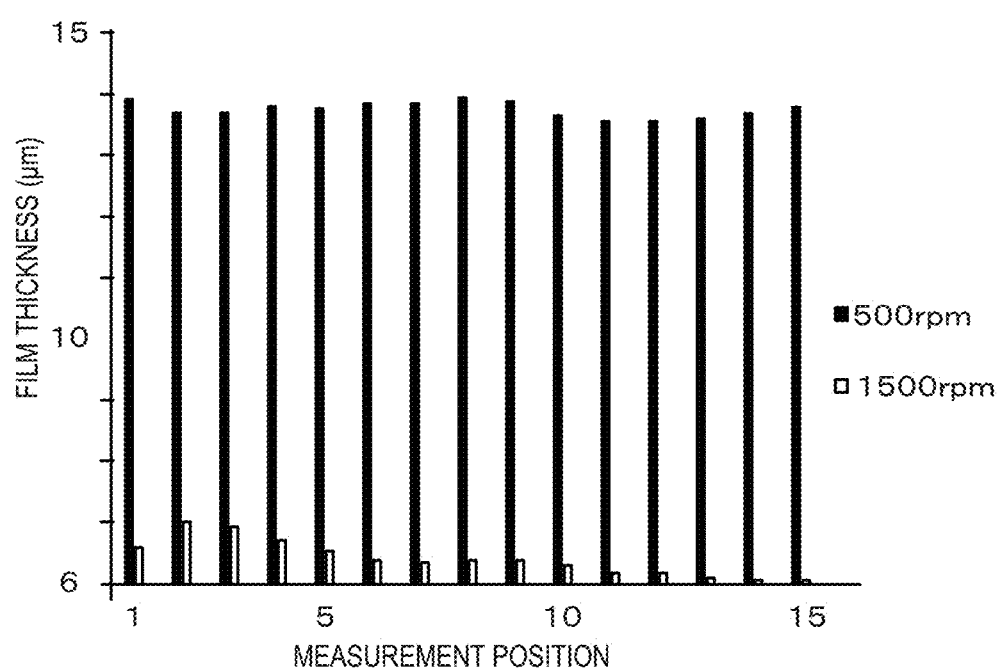
FIG. 2 is a graph illustrating a relation between a film thickness of a resist film located on a center portion of a recessed portion of a wafer and a measurement position of the film thickness on the wafer.

FIG. 2 is a graph illustrating a relation between a film thickness of a resist film located on a center portion of the recessed portion B of the wafer W and a measurement position of the film thickness on the wafer W. The measurement positions are located on a straight line linking the center of the wafer W and a predetermined position at an outer peripheral end. Note that the distances between measurement positions are equal. Further, the horizontal axis in FIG. 2 indicates the measurement position with a smaller number indicating a measurement position closer to the center of the wafer W, and the vertical axis indicates the measured film thickness.

As illustrated in the drawing, when the number of rotations at drying the resist film is 1500 rpm being a normal number of rotations, the film thickness of the resist film is as small as 7 µm or less, but gradually decreases outward and is nonuniform within a plane. In contrast to this, when the number of rotations at drying the resist film is as low as 500 rpm, the film thickness of the resist film is as large as about 14 µm that is equal to or more than 1.8 times 7 µm that is the target film thickness of the resist film, but becomes uniform within a plane.

Figure 3:
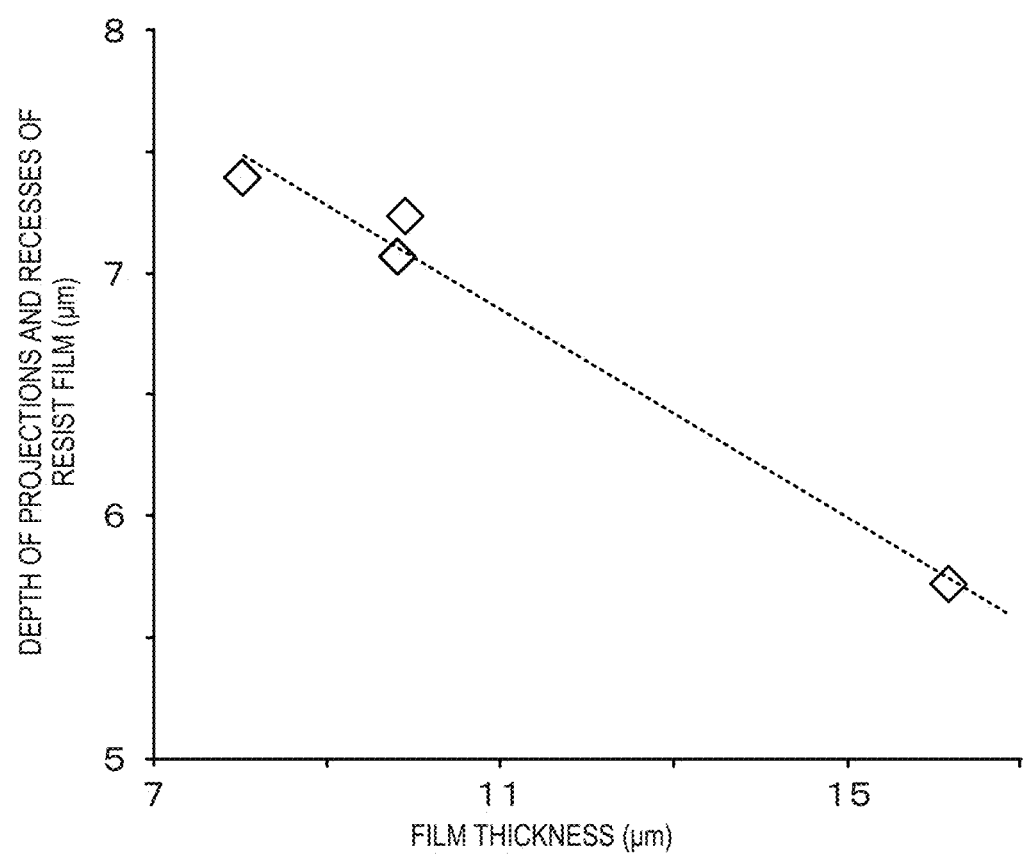
FIG. 3 is a graph illustrating a relation between the film thickness of the resist film and a depth of projections and recesses of the resist film.

Further, when the projections and recesses as in FIG. 1 are formed on the surface of the wafer W being a base of the resist film R, projections and recesses are formed also on the surface of the resist film R. Hence, the resist film R was formed under the same conditions as above, and the relation between the film thickness of the resist film R and the depth of the projections and recesses of the resist film R was investigated. FIG. 3 is a graph illustrating the above relation. The horizontal axis in FIG. 3 indicates the film thickness of the resist film on the projecting portion based on the upper surface of the projecting portion of the wafer W, and the vertical axis indicates the depth (see numeral H2 in FIG. 9 described later) of the projections and recesses of the resist film.

As illustrated in FIG. 3, as the film thickness of the resist film on the projecting portion of the wafer W is larger, the depth of the projections and recesses of the resist film is smaller. In particular, when the film thickness of the resist film R is 15 µm or more, the depth of the projections and recesses of the resist film R is 6 µm or less.

As described above, in the case where the projections and recesses having shapes as those on the wafer in the manufacturing process of the 3D-NAND semiconductor device, namely, the projections and recesses in which the projecting portion and the recessed portion are large in width and the recessed portion is low in aspect ratio, are formed on the surface of the wafer W, when the film thickness of the formed resist film is equal to or more than 1.8 times the target film thickness of the resist film, the film thickness becomes uniform within a plane, and the projections and recesses on the surface of the resist film reduce as the film thickness of the resist film becomes larger.

However, if the film thickness of the resist film is large, a resist film in an appropriate shape cannot be obtained in the recessed portion B of the wafer W even when the resist film is exposed in a predetermined pattern and developed.

Following embodiments of the present invention are based on results of the above-described investigation.

Hereinafter, the embodiments of the present invention will be described. Note that in this description and the drawings, components having substantially the same functional configurations are denoted by the same numerals to omit duplicated explanation.

First Embodiment

Figure 4:
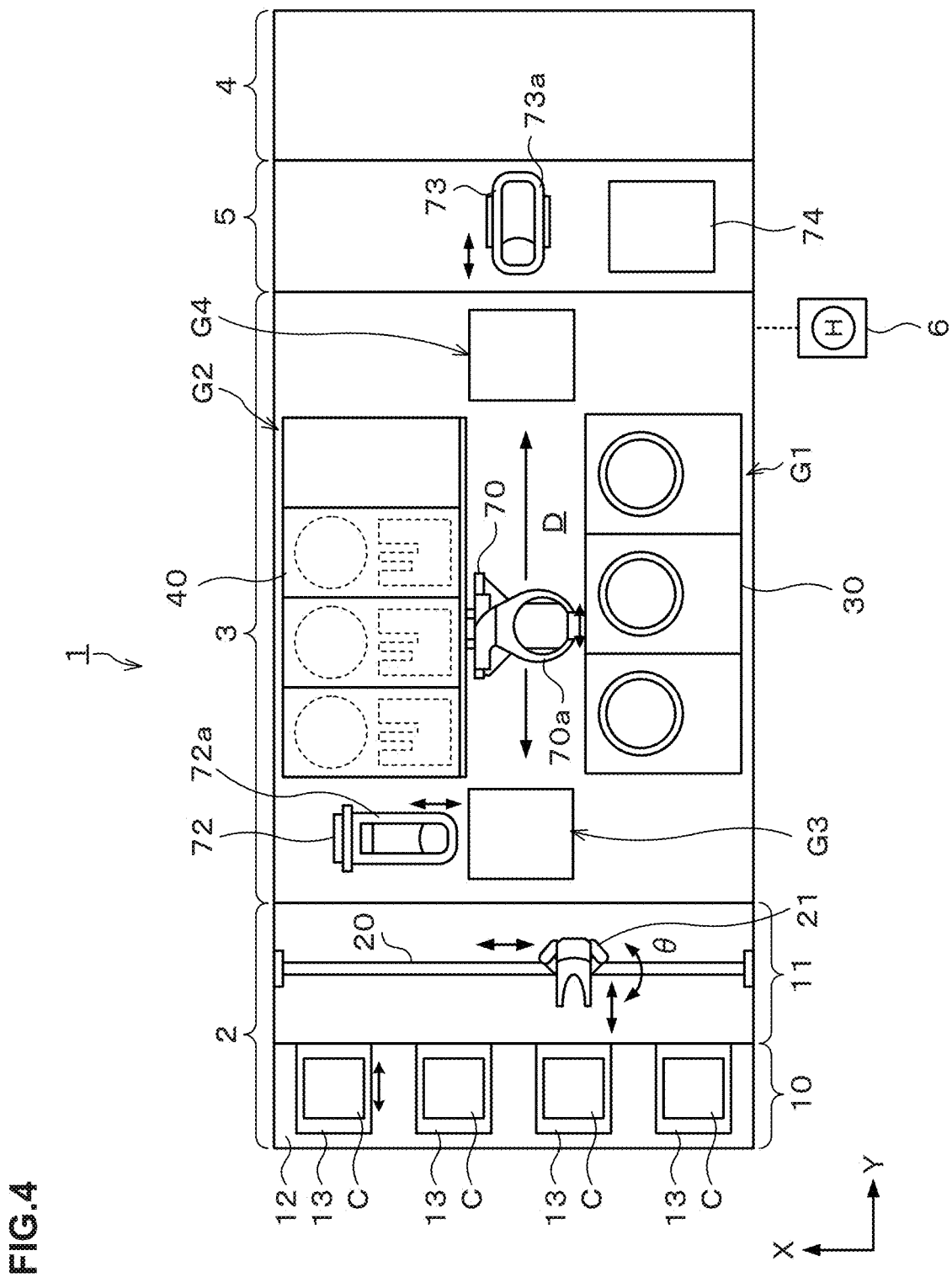
FIG. 4 is a plan view illustrating the outline of a configuration of a substrate treatment system as a film forming system according to a first embodiment.
Figure 5:
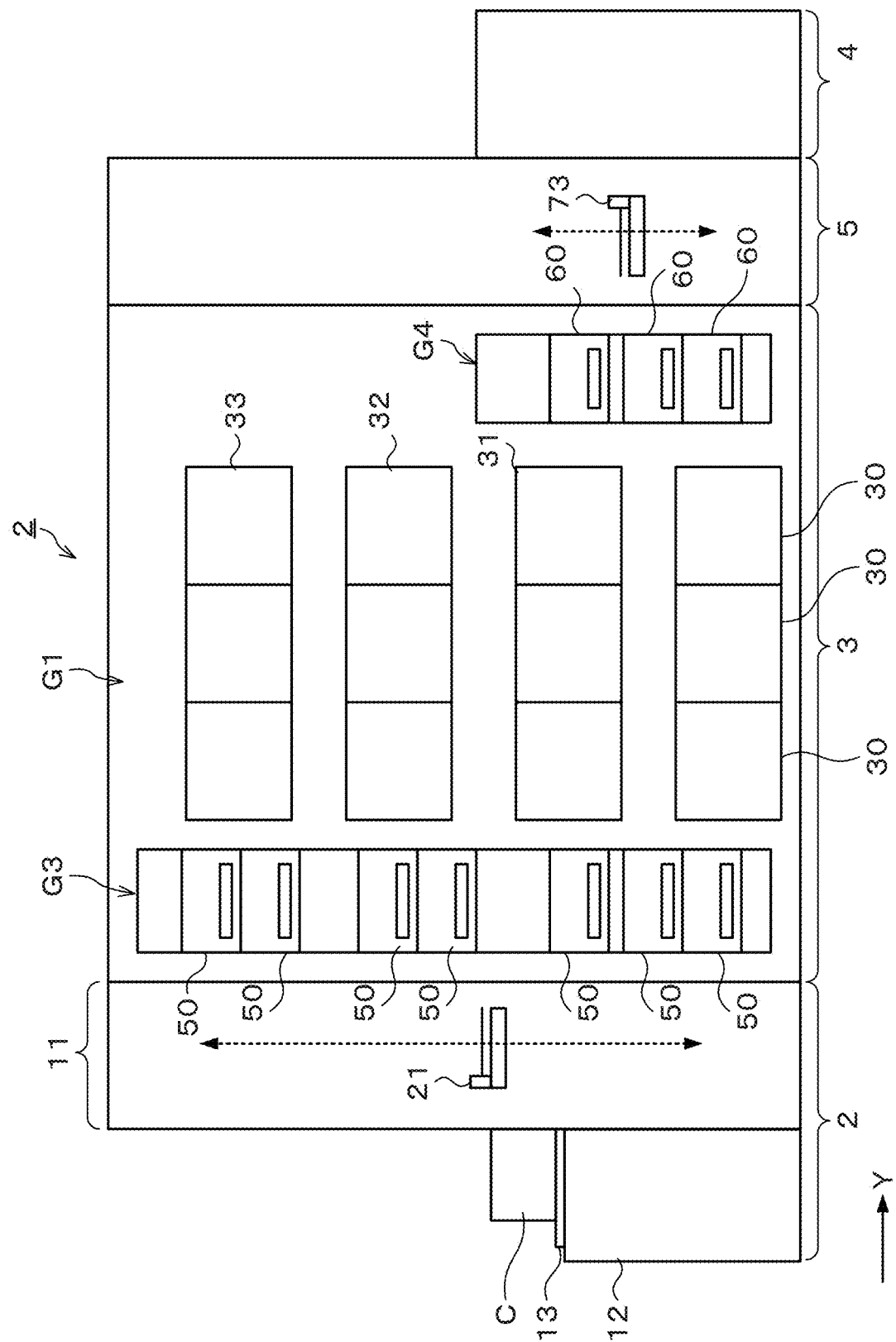
FIG. 5 is a front view illustrating the outline of the configuration of the substrate treatment system as the film forming system according to the first embodiment.
Figure 6:
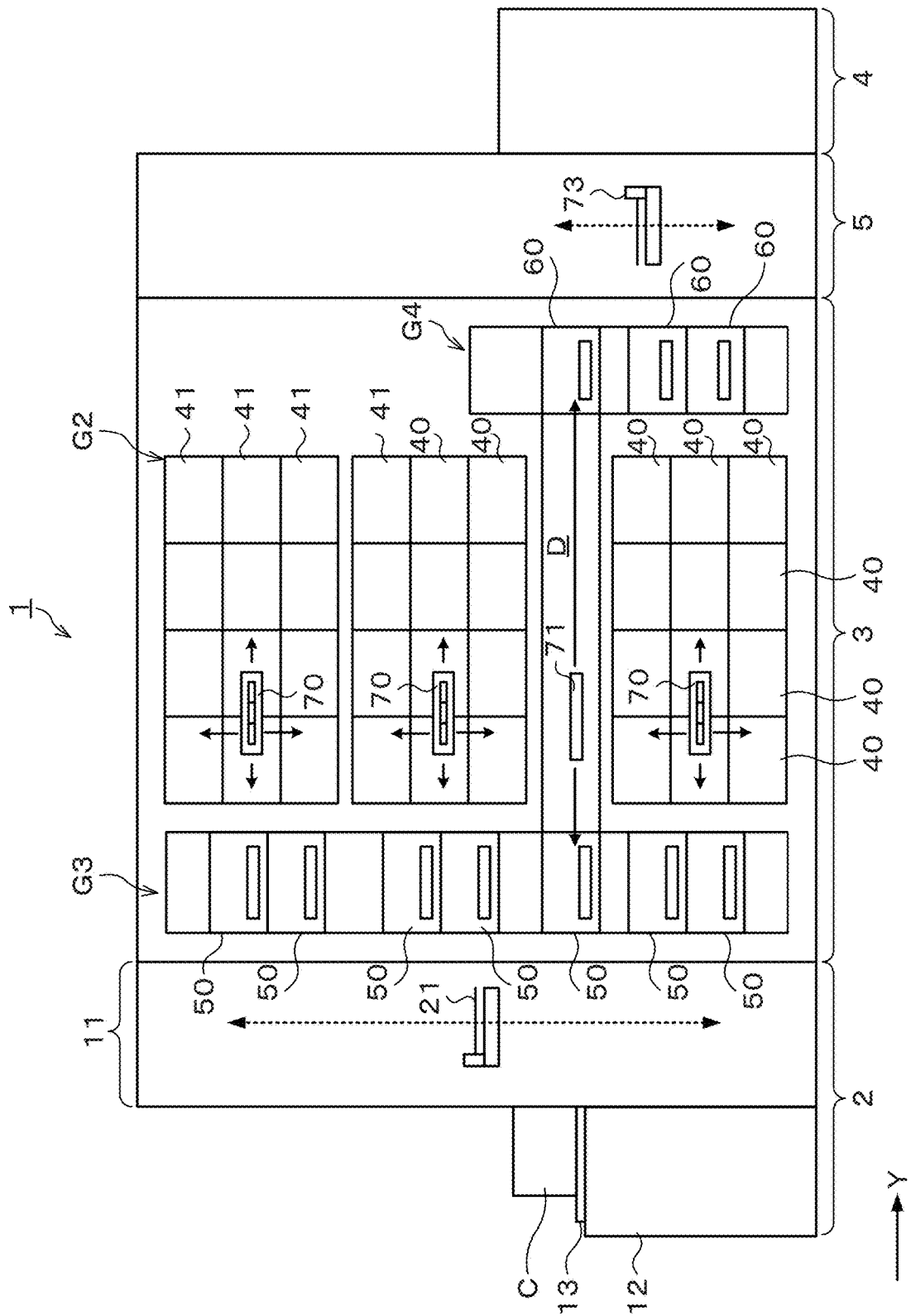
FIG. 6 is a rear view illustrating the outline of the configuration of the substrate treatment system as the film forming system according to the first embodiment.

FIG. 4 is an explanatory view illustrating the outline of an internal configuration of a substrate treatment system 1 as a film forming system according to a first embodiment. FIG. 5 and FIG. 6 are a front view and a rear view illustrating the outline of the internal configuration of the film forming system 1, respectively. Note that an example where the substrate treatment system 1 applies a resist solution as a coating solution onto a wafer W as a substrate to form a resist film as a coating film will be described in the following. Further, a predetermined pattern of a silicon oxide film ($SiO_2$ film) or the like is layered in advance on a surface of the wafer to be treated in the film forming system 1, and projections and recesses as described using FIG. 17, namely, projections and recesses in which the projecting portion and the recessed portion are large in width and the recessed portion is low in aspect ratio (ratio of the depth of the recessed portion to the width of the recessed portion) are formed.

The substrate treatment system 1 has, as illustrated in FIG. 4, a configuration in which, for example, a cassette station 2 as a transfer-in/out unit which transfers a cassette C into/from the outside, a treatment station 3 which includes a plurality of various treatment apparatuses which perform predetermined treatments such as coating treatment of the resist solution and so on, and an interface station 5 which delivers the wafer W to/from an exposure apparatus 4 adjacent to the treatment station 3, are integrally connected. The substrate treatment system 1 further includes a control unit 6 which controls the substrate treatment system 1.

The cassette station 2 is divided into, for example, a cassette transfer in/out section 10 and a wafer transfer section 11. The cassette transfer in/out section 10 is provided, for example, at an end portion on a Y-direction negative direction (left direction in FIG. 4) side in the substrate treatment system 1. In the cassette transfer in/out section 10, a cassette mounting table 12 is provided. On the cassette mounting table 12, a plurality of, for example, four mounting plates 13 are provided. The mounting plates 13 are provided arranged in a line in an X-direction being a horizontal direction (a vertical direction in FIG. 4). On these mounting plates 13, cassettes C can be mounted when the cassettes C are transferred in/out from/to the outside of the substrate treatment system 1.

In the wafer transfer section 11, a wafer transfer apparatus 21 is provided which is movable on a transfer path 20 extending in the X-direction as illustrated in FIG. 4. The wafer transfer apparatus 21 is movable also in an up-down direction and around a vertical axis (in a θ-direction), and can transfer the wafer W between the cassette C on each of the mounting plates 13 and later-described delivery apparatus included in a third block G3 in the treatment station 3.

In the treatment station 3, a plurality of, for example, first to fourth four blocks G1, G2, G3, G4 are provided each including various apparatuses. For example, the first block G1 is provided on the front side (an X-direction negative direction side in FIG. 4) in the treatment station 3, and the second block G2 is provided on the rear side (an X-direction positive direction side in FIG. 4) in the treatment station 3. Further, the third block G3 is provided on the cassette station 2 side (a Y-direction negative direction side in FIG. 4) in the treatment station 3, and the fourth block G4 is provided on the interface station 5 side (a Y-direction positive direction side in FIG. 4) in the treatment station 3.

In the first block G1, as illustrated in FIG. 5, a plurality of solution treatment apparatuses, for example, developing treatment apparatuses 30, coating treatment apparatuses 31, acid treatment apparatuses 32, and other developing treatment apparatuses 33 are arranged in this order from the bottom. The developing treatment apparatus 30 develops the wafer W exposed by the exposure apparatus 4 with a developing solution. The coating treatment apparatus 31 applies the resist solution onto the wafer W to form a resist film. The acid treatment apparatus 32 is an example of a "surface treatment apparatus" that performs a "surface treatment" of modifying the surface of the resist film into a state of being soluble in the developing solution, and performs as the "surface treatment" an acid treatment of applying an acid to the surface of the resist film on the wafer W. The other developing treatment apparatus 33 performs a developing treatment of the resist film subjected to the surface treatment by the acid treatment apparatus 32, thereby removing the surface of the resist film.

For example, the developing treatment apparatus 30, the coating treatment apparatus 31, the acid treatment apparatus 32, and the other developing treatment apparatus 33 are arranged three each in the horizontal direction. Note that the numbers and the arrangement of the developing treatment apparatuses 30, the coating treatment apparatuses 31, the acid treatment apparatuses 32, and the other developing treatment apparatuses 33 can be arbitrarily selected.

In each of the developing treatment apparatus 30, the coating treatment apparatus 31, the acid treatment apparatus 32, and the other developing treatment apparatus 33, for example, spin coating of applying a predetermined coating solution onto the wafer W is performed. In the spin coating, the coating solution is discharged, for example, from a coating nozzle onto the wafer W, and the wafer W is rotated to diffuse the coating solution over the surface of the wafer W. Note that the configuration of the acid treatment apparatus 32 will be described later.

For example, in the second block G2, as illustrated in FIG. 6, thermal treatment apparatuses 40 each of which performs thermal treatments such as heating and cooling on the wafer W, and adhesion apparatuses 41 each for enhancing adhesion between the resist solution and the wafer W, are provided side by side in the vertical direction and in the horizontal direction. The numbers and the arrangement of the thermal treatment apparatuses 40 and the adhesion apparatuses 41 can also be arbitrarily selected.

In the third block G3, a plurality of delivery apparatuses 50 are provided. Further, a plurality of delivery apparatuses 60 are provided also in the fourth block G4.

As illustrated in FIG. 4, a wafer transfer region D is formed in a region surrounded by the first block G1 to the fourth block G4. In the wafer transfer region D, for example, a wafer transfer apparatus 70 is arranged.

The wafer transfer apparatus 70 has a transfer arm 70a movable, for example, in the Y-direction, the front-back direction, the θ-direction, and the up-down direction. The wafer transfer apparatus 70 can move in the wafer transfer region D to transfer the wafer W to a predetermined apparatus in the first block G1, the second block G2, the third block G3 and the fourth block G4 therearound. A plurality of wafer transfer apparatuses 70 are arranged in the up-down direction as illustrated in FIG. 6, and can transfer the wafer W to a predetermined apparatus at a height of the same level in each of the blocks G1 to G4.

Further, in the wafer transfer region D, a shuttle transfer apparatus 71 is provided which linearly transfers the wafer W between the third block G3 and the fourth block G4.

The shuttle transfer apparatus 71 is configured to be linearly movable, for example, in the Y-direction in FIG. 6. The shuttle transfer apparatus 71 can move in the Y-direction while supporting the wafer W, and transfer the wafer W between the delivery apparatus 50 in the third block G3 and the delivery apparatus 60 in the fourth block G4 which are at the height of the same level.

As illustrated in FIG. 4, a wafer transfer apparatus 72 is provided on the X-direction positive direction side of the third block G3. The wafer transfer apparatus 72 has a transfer arm 72a that is movable, for example, in the front-back direction, the θ-direction, and the up-down direction. The wafer transfer apparatus 72 can move up and down while supporting the wafer W to transfer the wafer W to each of the delivery apparatuses 50 in the third block G3.

In the interface station 5, a wafer transfer apparatus 73 and a delivery apparatus 74 are provided. The wafer transfer apparatus 73 has a transfer arm 73a that is movable, for example, in the Y-direction, the θ-direction, and the up-down direction. The wafer transfer apparatus 73 can transfer the wafer W to/from each of the delivery apparatuses 60 in the fourth block G4, the delivery apparatus 74 and the exposure apparatus 4, for example, while supporting the wafer W by the transfer arm 73a.

The aforementioned control unit 6 is, for example, a computer including a program storage unit (not illustrated). In the program storage unit, a program for controlling the operations of the above-described various treatment apparatuses and the drive system such as the transfer apparatuses so as to control the treatments on the wafer W including the film forming treatment in the substrate treatment system 1 is stored. Note that the program may be the one that is recorded, for example, in a computer-readable storage medium H such as a computer-readable hard disk (HD), flexible disk (FD), compact disk (CD), magneto-optical disk (MO), or memory card, and installed from the storage medium H into the control unit 6.

Figure 7:
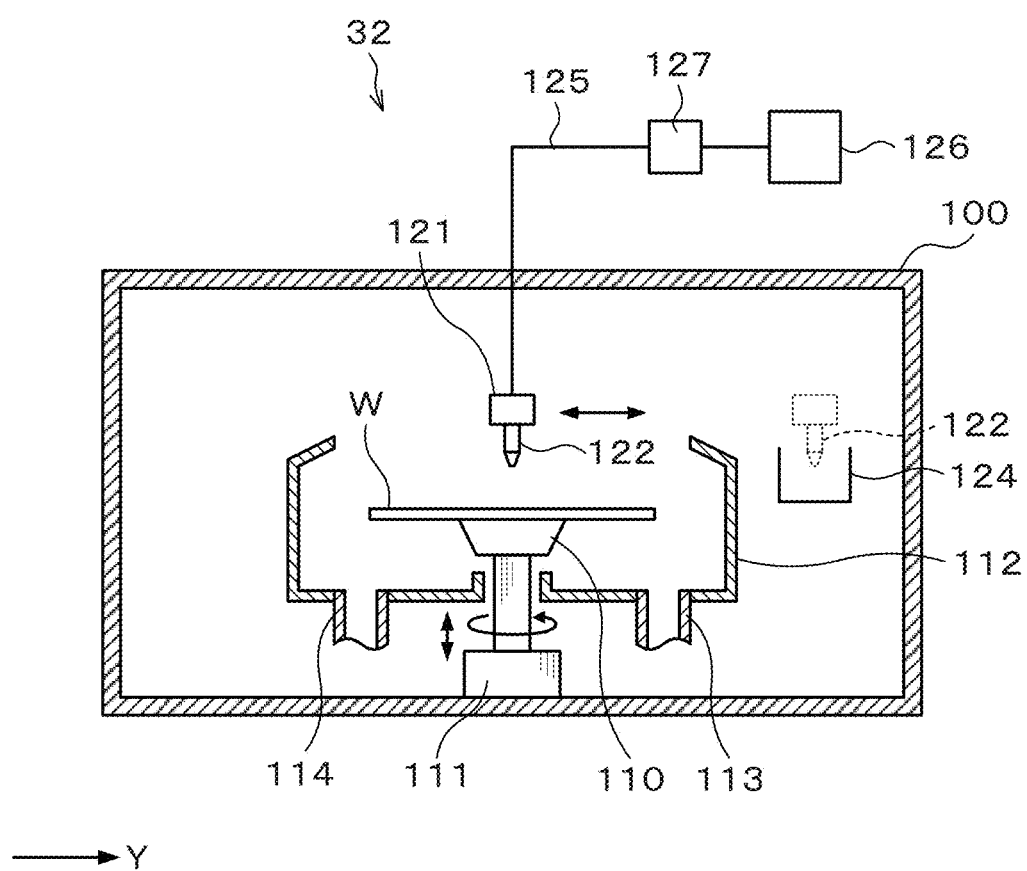
FIG. 7 is a longitudinal sectional view illustrating the outline of a configuration of an acid treatment apparatus.
Figure 8:
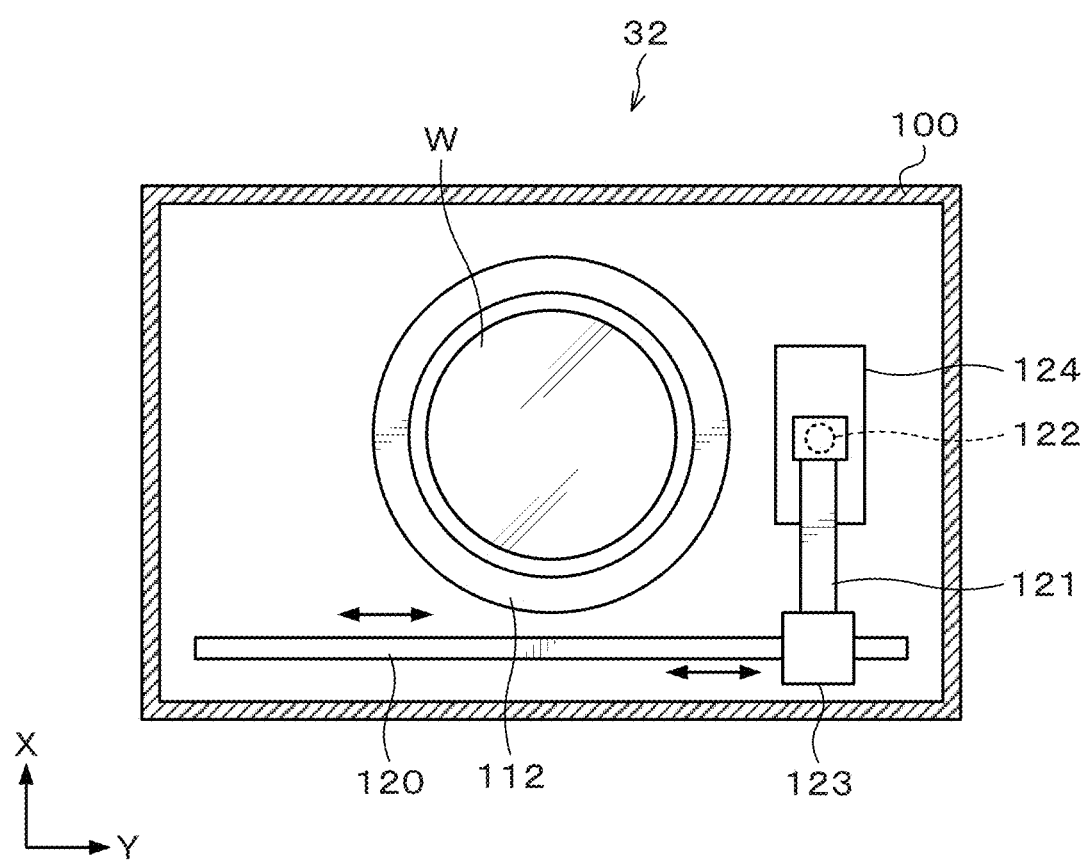
FIG. 8 is a transverse sectional view illustrating the outline of the configuration of the acid treatment apparatus.

Next, the configuration of the aforementioned acid treatment apparatus 32 will be described. FIG. 7 and FIG. 8 are a longitudinal sectional view and a transverse sectional view illustrating the outline of the configuration of the acid treatment apparatus 32, respectively.

The acid treatment apparatus 32 is to perform an acid treatment of applying an acid to the surface of the resist film on the wafer W as the "surface treatment" of modifying the surface of the resist film into a state of being soluble in the developing solution, and has a treatment container 100 whose inside can be closed as illustrated in FIG. 7 and FIG. 8. A side surface on the wafer transfer apparatus 70 side of the treatment container 100 is formed with a transfer-in/out port (not illustrated) for the wafer W, and an opening and closing shutter (not illustrated) is provided at the transfer-in/out port.

At a central portion in the treatment container 100, a spin chuck 110 that holds and rotates the wafer W is provided. The spin chuck 110 has a horizontal upper surface, and the upper surface is provided with, for example, a suction port (not illustrated) for sucking the wafer W. By suction through the suction port, the wafer W can be suction-held on the spin chuck 110.

Below the spin chuck 110, a chuck drive unit 111 including, for example, a motor is provided. The spin chuck 110 can rotate at a predetermined speed by the chuck drive unit 111. Further, the chuck drive unit 111 is provided with, for example, a raising and lowering drive source such as a cylinder so that the spin chuck 110 freely rises and lowers.

Around the spin chuck 110, a cup 112 is provided which receives and collects liquid splashing or dropping from the wafer W. A drain pipe 113 for draining the collected liquid and an exhaust pipe 114 for evacuating and exhausting the atmosphere in the cup 112 are connected to the lower surface of the cup 112.

As illustrated in FIG. 8, on an X-direction negative direction (lower direction in FIG. 8) side of the cup 112, a rail 120 is formed which extends along a Y-direction (right-left direction in FIG. 8). The rail 120 is formed, for example, from a Y-direction negative direction (left direction in FIG. 8) side outer position to a Y-direction positive direction (right direction in FIG. 8) side outer position of the cup 112. To the rail 120, an arm 121 is attached.

On the arm 121, a coating nozzle 122 which supplies an acid as a coating solution onto the wafer W is supported as illustrated in FIG. 7 and FIG. 8. The arm 121 is movable on the rail 120 by means of a nozzle drive unit 123 illustrated in FIG. 8. This allows the coating nozzle 122 to move from a waiting section 124 provided at a Y-direction positive direction side outer position of the cup 112 to a position above a center portion of the wafer W in the cup 112 and further move in a diameter direction of the wafer W above the wafer W. The arm 121 is movable up and down by means of the nozzle drive unit 123 to be able to adjust the height of the coating nozzle 122.

To the coating nozzle 122, a supply pipe 125 is connected which supplies the acid to the coating nozzle 122 as illustrated in FIG. 7. The supply pipe 125 communicates with an acid supply source 126 which stores the acid therein. Further, the supply pipe 125 is provided with a supply equipment group 127 including a valve, a flow regulator and so on for controlling the flow of the acid.

The configurations of the developing treatment apparatus 30, the coating treatment apparatus 31, and the other developing treatment apparatus 33 are the same as the configuration of the above-described acid treatment apparatus 32. However, the coating solution to be supplied from the coating nozzle is different among the developing treatment apparatus 30, the coating treatment apparatus 31, the other developing treatment apparatus 33, and the acid treatment apparatus 32. Further, a rinse solution is applied as the coating solution in addition to the developing solution in some cases in the developing treatment apparatus 30, and a prewet solution is applied in addition to the resist solution in some cases in the coating treatment apparatus 31. In these cases, each of the solution treatment apparatuses has a coating nozzle, a drive unit for driving the coating nozzle and so on for each coating solution.

Figure 9:
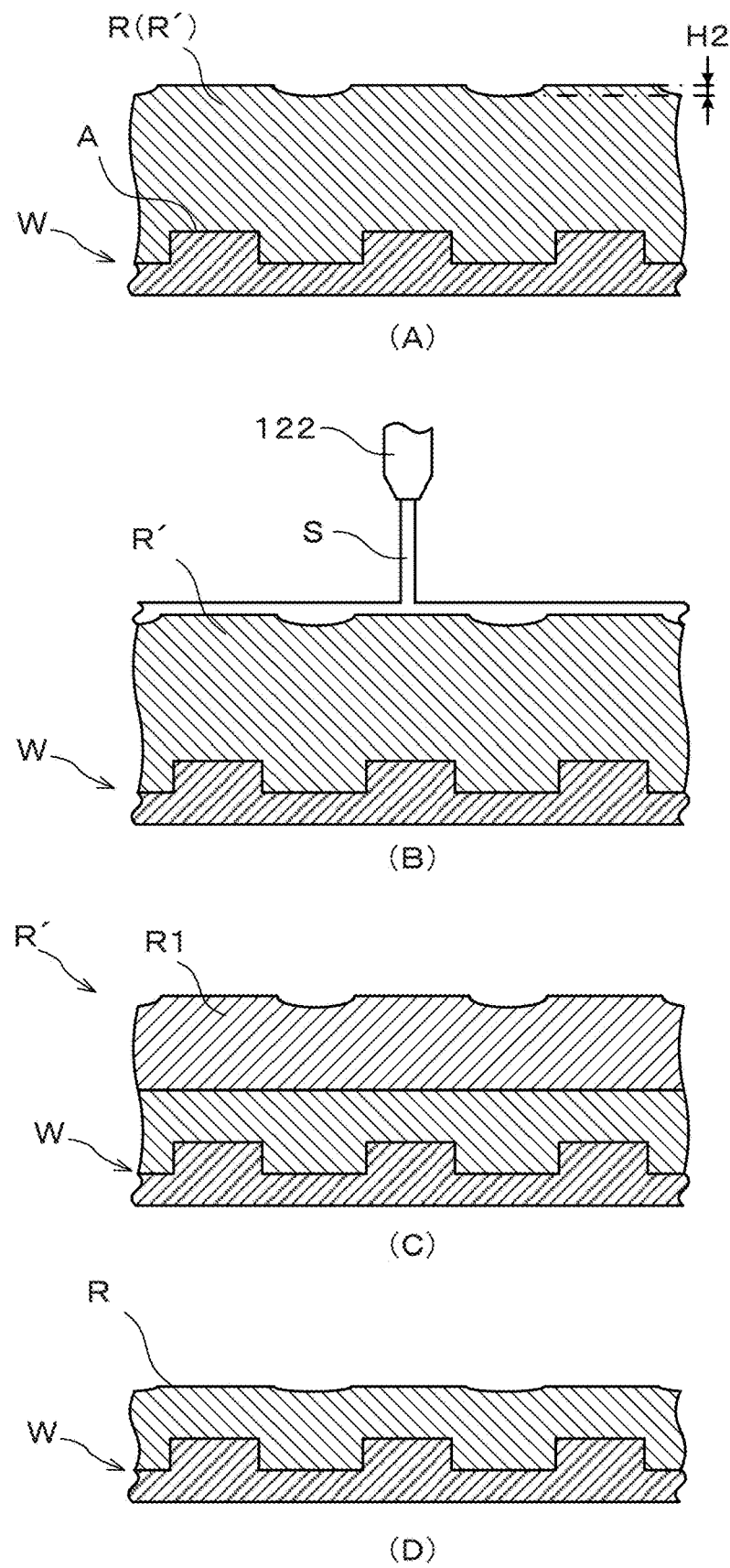
FIG. 9 is a schematic view illustrating a state of the wafer at each step of the film forming treatment of the resist film.
Figure 17:
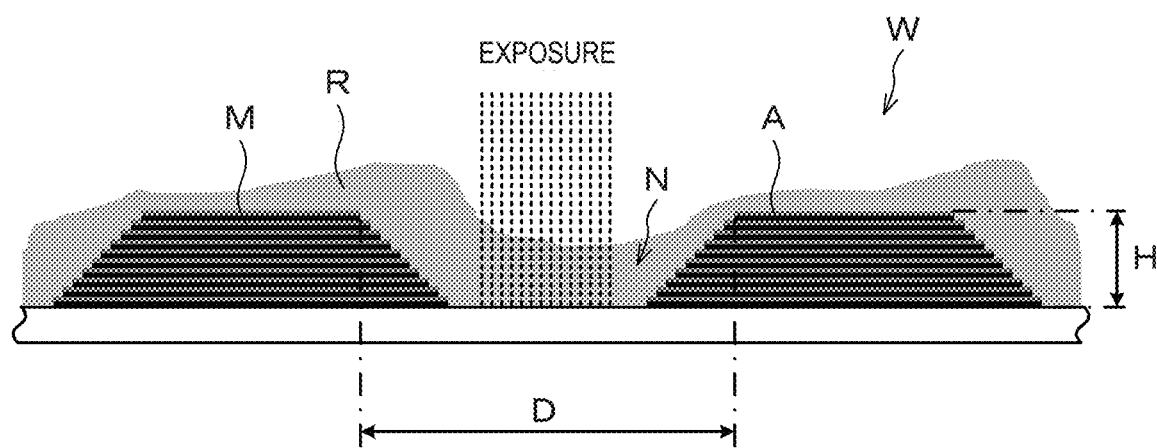
FIG. 17 is a schematic view illustrating an example of a wafer in a manufacturing process of a 3D-NAND semiconductor device.

Next, the wafer treatment including a film forming treatment of a resist film having a target film thickness using the substrate treatment system 1 will be described. FIG. 9 is a schematic view illustrating the state of the wafer W at each step of the film forming treatment. Note that on the surface of the wafer W treated in the substrate treatment system 1, projections and recesses are formed by a predetermined pattern of a $SiO_2$ film or the like as illustrated in FIG. 17. Further, it is assumed that both the target film thickness of the resist film and the depth of the projections and recesses on the surface of the wafer W are 7 μm.

In the wafer treatment using the substrate treatment system 1, first, a wafer W is taken out of the cassette C on the cassette mounting table 12 by the wafer transfer apparatus 21 and transferred to the delivery apparatus 50 in the treatment station 3.

Then, the wafer W is transferred by the wafer transfer apparatus 70 to the thermal treatment apparatus 40 in the second block G2 and subjected to a temperature regulation treatment. The wafer W is then transferred by the wafer transfer apparatus 70 to the coating treatment apparatus 31. In the coating treatment apparatus 31, the surface of the wafer W is spin-coated with the resist solution, whereby a resist film R is formed as illustrated in FIG. 9(A). As the resist solution in this embodiment, for example, an MUV resist, a KrF resist, an ArF resist or the like is used whose viscosity is a so-called middle viscosity, concretely, 90 to 1000 cP.

In the coating treatment apparatus 31, a resist film R having a film thickness larger than the target film thickness of the resist film R is formed. The resist film R formed by the coating treatment apparatus 31 is called a thick film R' in the following. The film thickness of the thick film R' is equal to or more than 1.5 times, preferably equal to or more than 1.8 times the target film thickness of the resist film R. Note that the reference point of the film thickness is the upper surface of the projecting portion A on the surface of the wafer W. When the thick film R' is formed as described above, the film thickness becomes uniform within the plane of the wafer W.

Further, since the projections and recesses are formed on the surface of the wafer W being the base of the thick film R' formed in the coating treatment apparatus 31, projections and recesses are formed also on the surface of the thick film R' itself. However, by making the film thickness large as described above, the depth H2 of the projections and recesses on the surface of the thick film R' becomes equal to or less than a predetermined value, for example, equal to or less than 0.9 times the depth of the recessed and projections of the wafer W being the base.

In other words, in the coating treatment apparatus 31, the thick film R' that is a coating film having a depth H2 of the projections and recesses of a predetermined value or less and having a film thickness larger than the target film thickness of the resist film R is formed.

Note that to form the thick film R', the rotation speed of the wafer W, in particular, the rotation speed of the wafer W at a drying step of the resist solution after stop of supply of the resist solution is set to low speed in the coating treatment apparatus 31. More specifically, the rotation speed of the wafer at the drying step is 300 to 750 rpm. The time of the drying step is 30 to 90 seconds.

The wafer W is then transferred to the thermal treatment apparatus 40 and subjected to a pre-baking treatment.

The wafer W is then transferred to the acid treatment apparatus 32. The wafer W transferred into the acid treatment apparatus 32 is supplied with an acid S from the coating nozzle 122 while rotated as illustrated in FIG. 9(B). The supplied acid S is diffused over the entire surface of the thick film R' by the centrifugal force, whereby an upper portion R1 of the thick film R' is modified into a state of being soluble in the developing solution as illustrated in FIG. 9(C). Specifically, polymers located in the upper portion of the thick film R' are deprotected, more specifically, protecting groups are changed by the acid S into development soluble polar groups with which the polymers become soluble in the developing solution.

The wafer W is then transferred to the thermal treatment apparatus 40 and subjected to a thermal treatment. The thermal treatment accelerates modification of the upper portion of the thick film R', namely, the deprotection of the polymers in the upper portion of the thick film R'.

The wafer W is then transferred to the other developing treatment apparatus 33 and subjected to a developing treatment. As the developing solution in the other developing treatment apparatus 33, the same developing solution as in the developing treatment apparatus 30 can be used and is, for example, tetramethylammonium hydroxide (TMAH). In the other developing treatment apparatus 33, a modified portion in the upper portion R1 of the thick film R' is removed as illustrated in FIG. 9(C) and FIG. 9(D), whereby the resist film R having the target film thickness is formed. The deprotection by the acid treatment proceeds uniformly within the plane of the wafer W. Therefore, if the resist film R before the acid treatment, namely, the thick film R' is uniform in film thickness within the plane as described above and is small in depth H2 of the projections and recesses on its surface, the resist film R having the target film thickness after the acid treatment and the developing treatment becomes uniform in film thickness within the plane and becomes small in depth of the projections and recesses on its surface, namely, becomes flat.

Note that in the case of performing the removing treatment, namely, an etch-back treatment on the upper portion R1 of the thick film R' by the acid treatment and the developing treatment, these treatments may be repeated a plurality of times to obtain the resist film R having the target film thickness. Besides, the amount of removing by a single removing treatment can be adjusted by the concentration or amount of the acid to be applied.

The wafer W is then transferred to the exposure apparatus 4 and subjected to exposure processing in a predetermined pattern.

The wafer W is then transferred to the thermal treatment apparatus 40 and subjected to a post-exposure baking treatment. The wafer W is then transferred to the developing treatment apparatus 30 and subjected to a developing treatment. After the developing treatment is finished, the wafer W is transferred to the thermal treatment apparatus 40 and subjected to a post-baking treatment. The wafer W is then transferred to the cassette C on the mounting plate 13, with which the substrate treatment in the substrate treatment system 1 is completed.

Since the thick film having a film thickness and being uniform within the plane is formed on the wafer having the projections and recesses, in which the projecting portion and the recessed portion are large in width and the recessed portion is low in aspect ratio, formed on the surface thereof, and the thick film is etched back down to the target film thickness in this embodiment, the resist film having the target film thickness and being uniform within the plane can be formed. Accordingly, when a pattern is formed, for example, on the recessed portion of the projections and recesses of the wafer W using the resist film as an etching mask, the CD of the pattern can be made uniform within the plane.

Further, since the resist film formed in this embodiment has a small depth of the projections and recesses on the surface, namely, the resist film is flat, the CD of each pattern can be improved.

Furthermore, the rotation speed in the spin coating of the resist solution is low and the etch-back treatment is required in this embodiment, but there is little or no influence on the throughput as compared with the case of decreasing the rotation speed down to 10 to 50 rpm.

Note that in the case where the depth of the projections and recesses of the wafer W being the base and the depth of the projections and recesses of the resist film are on a micrometer order, when the film thickness of the resist film is different at both ends in the same recessed portion N of the wafer W as illustrated in FIG. 17, defocus may occur at one of both ends. However, the film thickness of the resist film formed in this embodiment is substantially the same at both ends, thus causing no defocus of exposure light at both ends in the same recessed portion in pattern exposure. Accordingly, the pattern in an appropriate shape can be formed.

(Confirmation Test)

Figure 10:
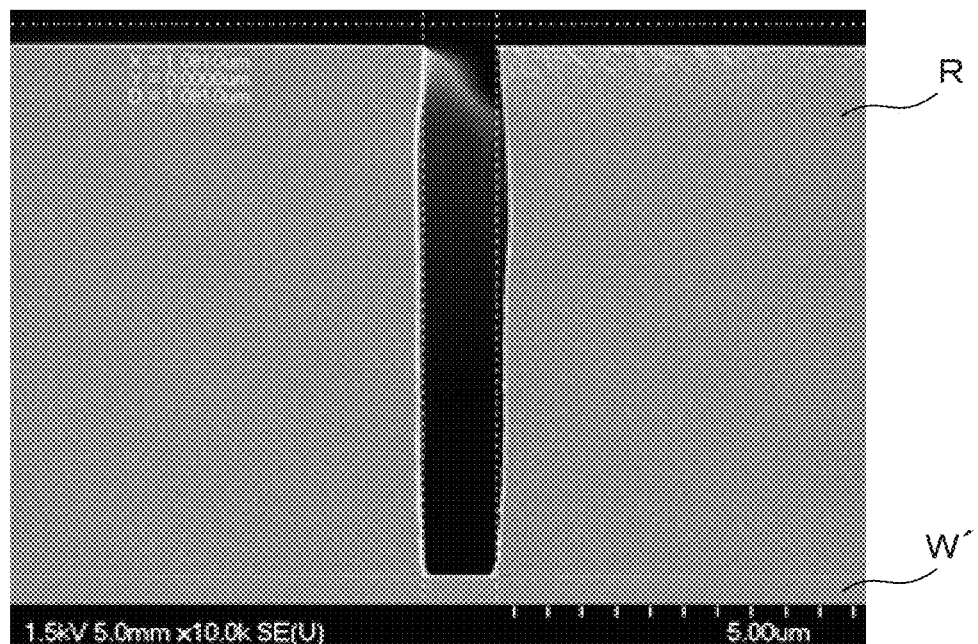
FIG. 10 is a view illustrating a result of a test of confirming whether or not a pattern formation by pattern exposure and development can be performed even on a resist film after a removing treatment using an acid and a developing solution.

FIG. 10 is a view illustrating a result of a test of confirming whether or not a pattern formation by pattern exposure and development can be performed even on a resist film after the removing treatment using the acid and the developing solution, and illustrates a cross section of the resist film R after pattern formation.

In the confirmation test, a thick film R' of 9.5 μm was formed on a bare silicon wafer W' and the resist film was etched back down to 6 μm with the acid and the developing solution, and then the pattern exposure and the developing treatment were performed so as to form a trench pattern having a remaining width of 5 μm and a void interval of 1 μm. Note that the resist solution used was a KrF resist solution having a viscosity of 171 cP and its application amount was 6.0 ml. Further, cyclohexane was used as a prewet thinner in forming the resist film. Further, the acid used was a TARC (Top Anti-Reflective Coating) chemical containing a acid, and the etch-back using the acid and the developing solution was repeated three times to obtain the resist film having the above-described film thickness.

In the confirmation test, the trench pattern in an excellent shape was able to be formed in the resist film R as illustrated in FIG. 10.

This confirmation test is for the resist film on the bare silicon wafer W', namely, a wafer' having a flat surface, and it is conceivable that the similar result can be obtained even on a wafer having the projections and recesses in which the projecting portion and the recessed portion are large in width and the recessed portion is low in aspect ratio.

Figure 11:
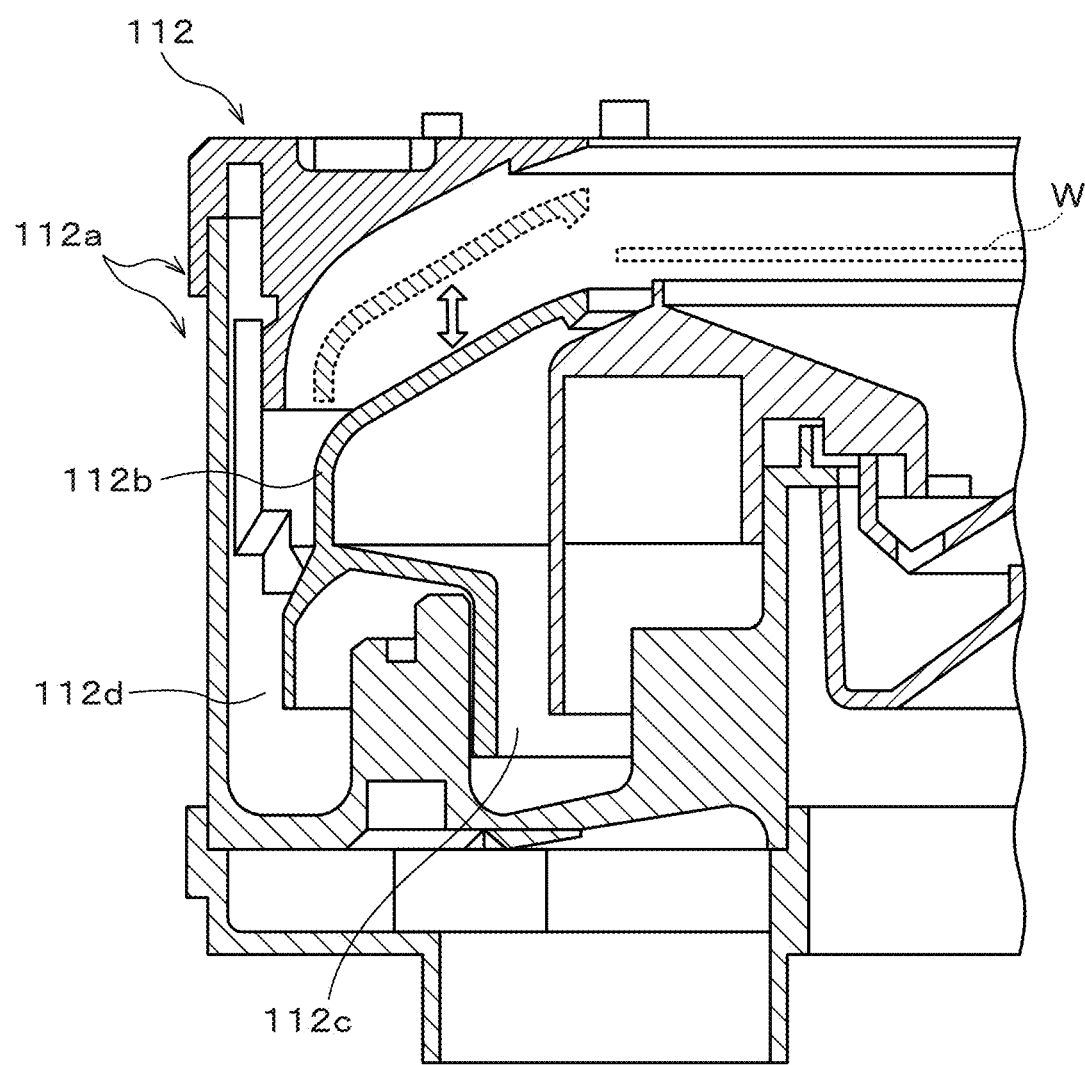
FIG. 11 is an explanatory view for another example of the apparatus which performs the coating treatment and the acid treatment on the resist film.

FIG. 11 is an explanatory view for another example of the apparatus which performs the coating treatment and the acid treatment on the resist film in the substrate treatment system according to this embodiment, and illustrates the cross section of the cup 112 which collects the resist solution and so on.

Though the coating treatment and the acid treatment on the resist film are performed in separate apparatuses in the above example, both the coating treatment and the acid treatment may be performed in the same apparatus.

In the case where the treatments are performed in the same apparatus as described above, the apparatus preferably has a cup 112 as illustrated in FIG. 11 which collects both the resist solution and the acid splashing with the rotation of the wafer W. The cup 112 has a cup body 112a which covers the side and the upper portion of a region outside the wafer W, and a movable cup 112b which is movable in the up-down direction with respect to the cup body 112a, namely, movable in the up-down direction also with respect to the wafer W. In this cup 112, for example, raising the movable cup 112b in the acid treatment allows the acid splashing from the rotated wafer W to pass through the lower side of the movable cup 112b and introduces the acid into an inside flow passage 112c of the cup body 112a for collection. Further, in the cup 112, lowering the movable cup 112b in the coating treatment of the resist solution allows the resist solution splashing from the rotated wafer W to pass through the upper side of the movable cup 112b and introduces the resist solution into an outside flow passage 112d of the cup body 112a. Thus, the waste acid and the waste resist solution can be separately collected without mixing them.

Note that the coating treatment and the acid treatment on the resist film are performed in the same apparatus as described above, the wafer W is transferred out of the apparatus after the coating treatment and subjected to a thermal treatment, and then transferred into the same apparatus and subjected to the acid treatment.

Further, the treatments performed in the same apparatus may be the acid treatment and the developing treatment.

Second Embodiment

Though the acid treatment is performed as the surface treatment of modifying the upper portion of the thick film into a state of being soluble in the developing solution in the above first embodiment, this embodiment is to perform ultraviolet irradiation processing as the surface treatment.

Figure 12:
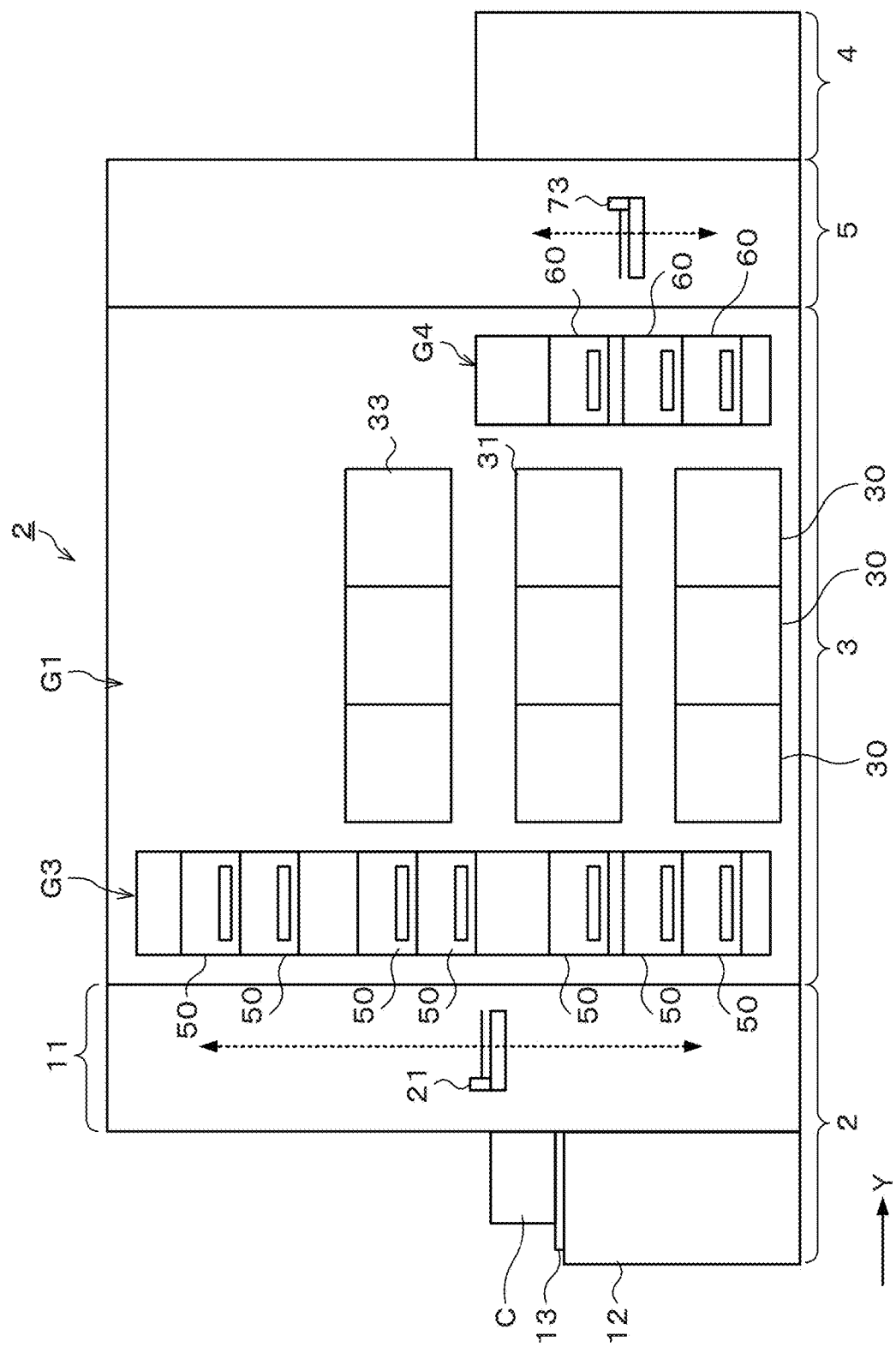
FIG. 12 is a front view illustrating the outline of a configuration of a substrate treatment system as a film forming system according to a second embodiment.
Figure 13:
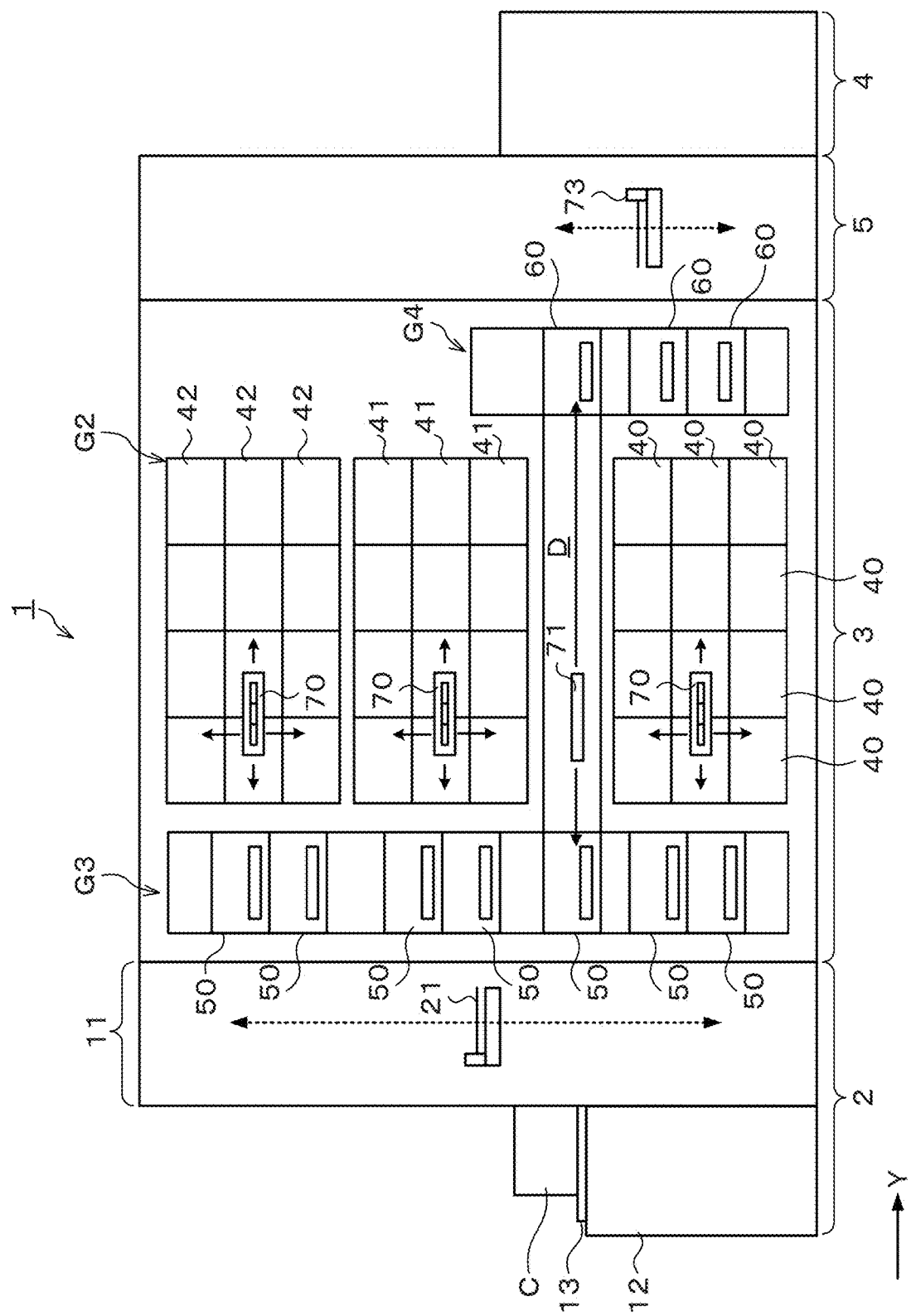
FIG. 13 is a rear view illustrating the outline of the configuration of the substrate treatment system as the film forming system according to the second embodiment.

FIG. 12 and FIG. 13 are a front view and a rear view illustrating the outline of an internal configuration of a substrate treatment system 1 as a film forming system according to a second embodiment of the present invention, respectively. A plan view of this substrate treatment system is the same as that in FIG. 4 and is thus omitted.

The substrate treatment system 1 in FIG. 12 and FIG. 13 does not include the acid treatment apparatuses 32 in the first block G1 but includes ultraviolet processing apparatuses 42 instead as the surface treatment apparatuses in the second block G2, unlike the substrate treatment system in FIG. 4 to FIG. 6.

Figure 14:
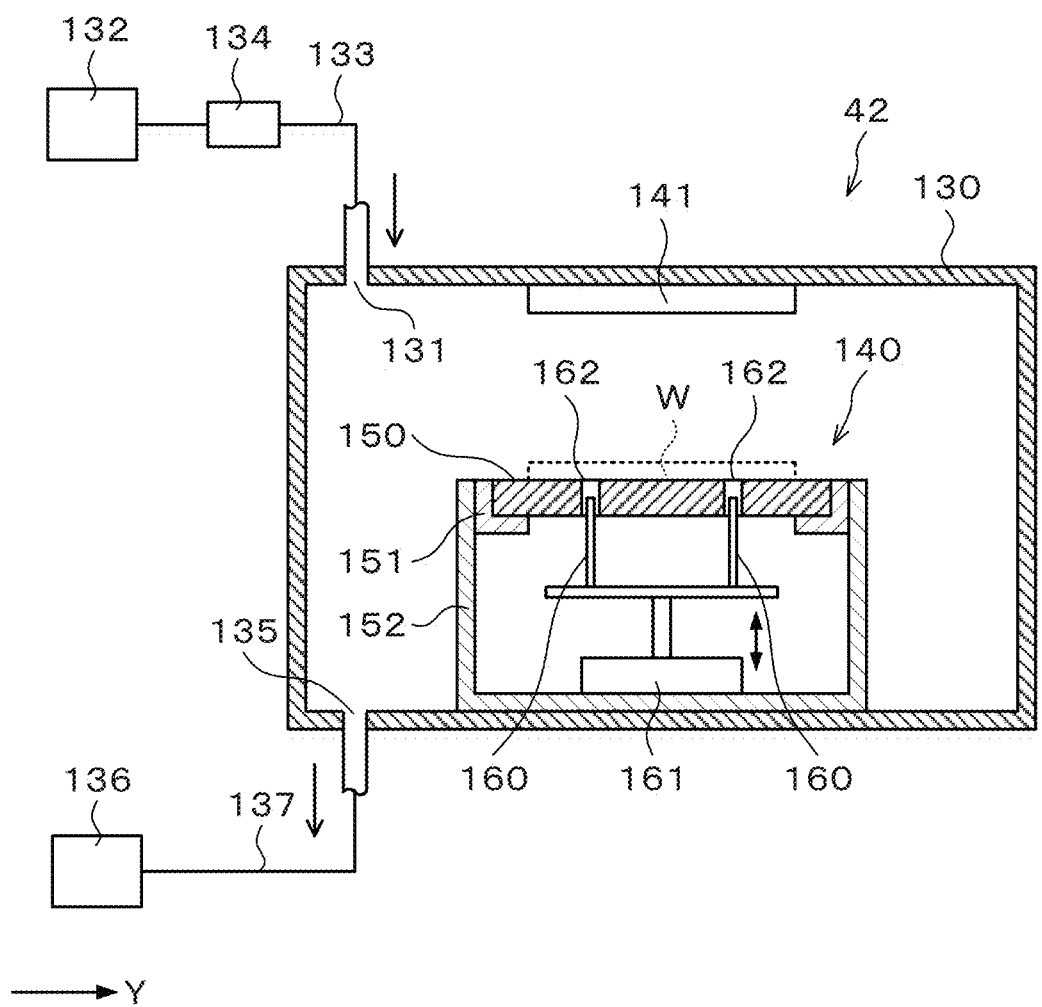
FIG. 14 is a longitudinal sectional view illustrating the outline of a configuration of an ultraviolet processing apparatus.
Figure 15:
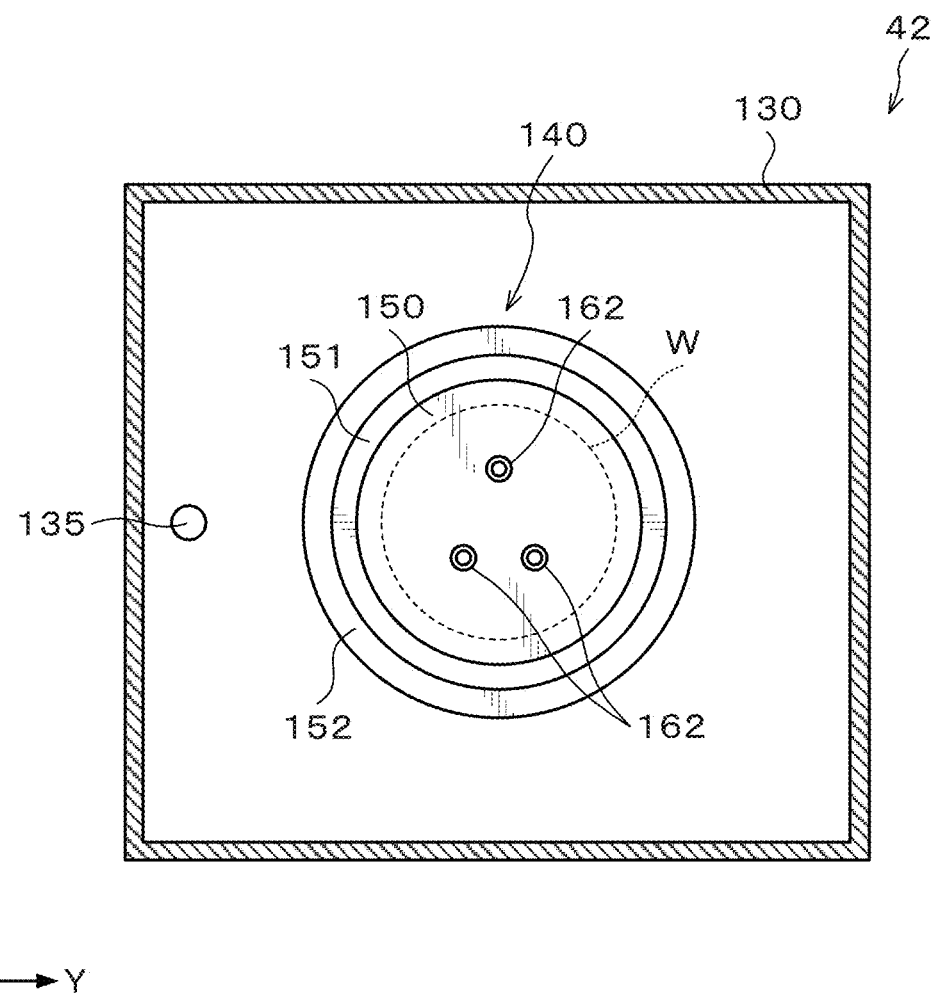
FIG. 15 is a transverse sectional view illustrating the outline of the configuration of the ultraviolet processing apparatus.

FIG. 14 and FIG. 15 are a longitudinal sectional view and a transverse sectional view illustrating the outline of the configuration of the ultraviolet processing apparatus 42, respectively.

The ultraviolet processing apparatus 42 in FIG. 14 and FIG. 15 is to perform ultraviolet irradiation processing of irradiating the surface of the resist film on the wafer W with an ultraviolet ray as the "surface treatment" of modifying the surface of the resist film into a state of being soluble in the developing solution, and has a treatment container 130 whose inside can be closed. A side surface on the wafer transfer apparatus 73 side of the treatment container 130 is formed with a transfer-in/out port (not illustrated) for the wafer W, and an opening and closing shutter (not illustrated) is provided at the transfer-in/out port.

On a ceiling surface of the treatment container 130, a gas supply port 131 is formed which supplies, for example, an inert gas into the treatment container 130. To the gas supply port 131, a gas supply pipe 133 communicating with a gas supply source 132 is connected. The gas supply pipe 133 is provided with a supply equipment group 134 including a valve, a flow regulator and so on for controlling the flow of the inert gas.

Note that it is adoptable to bring the inside of the treatment container 130 into an air atmosphere without supplying a specific gas into the treatment container 130. In this case, the gas supply port 131, the gas supply source 132, the gas supply pipe 133, and the supply equipment group 134 may be omitted.

A bottom surface of the treatment container 130 is formed with a suction port 135 that sucks the atmosphere inside the treatment container 130. To the suction port 135, a suction pipe 137 communicating with a negative pressure generating device 136 such as, for example, a vacuum pump is connected.

Inside the treatment container 130, a wafer holding unit 140 and an ultraviolet irradiation unit 141 are provided. The ultraviolet irradiation unit 141 is arranged above the wafer holding unit 140.

The wafer holding unit 140 includes a mounting table 150 in a disk shape on which the wafer W is mounted, an annular holding member 151 that accommodates the mounting table 150 and holds the outer peripheral portion of the mounting table 150, and a substantially cylindrical support ring 152 that surrounds the outer periphery of the holding member 151 and holds the mounting table 150 via the holding member 151.

Below the mounting table 150, for example, three raising and lowering pins 160 for supporting the wafer W from below and raising and lowering the wafer W are provided. The raising and lowering pins 160 can move up and down by means of a raising and lowering drive unit 161. Near the central portion of the mounting table 150, through holes 162 penetrating the mounting table 150 in the thickness direction thereof are formed, for example, at three positions. The raising and lowering pins 160 are inserted into the through holes 162 to be able to project from the upper surface of the mounting table 150.

The ultraviolet irradiation unit 141 irradiates the wafer W formed with the resist film on the mounting table 150 with an ultraviolet ray. As the wavelength of the irradiated ultraviolet ray, a wavelength suitable for the resist film is used and is, for example, 248 nm. Note that though the ultraviolet irradiation unit 141 is provided to be supported on the ceiling surface of the treatment container 130 in the illustrated example, the ultraviolet irradiation unit 141 may be provided on a glass window (not illustrated) provided on the ceiling surface of the treatment container 130. In this case, the ultraviolet ray radiated from the ultraviolet irradiation unit 141 enters the inside of the treatment container 130 via the glass window.

Next, the wafer treatment performed using the substrate treatment system 1 in FIG. 12 and FIG. 13 will be described using FIG. 9. Note that the treatment until the pre-baking treatment is the same as in the substrate treatment system 1 in FIG. 4 and FIG. 5, and therefore the description thereof will be omitted.

After the pre-baking treatment, the wafer W is transferred to the ultraviolet processing apparatus 42. The ultraviolet irradiation unit 141 irradiates the entire surface of the thick film R' on the wafer W transferred into the ultraviolet processing apparatus 42 with the ultraviolet ray. The ultraviolet ray modifies the upper portion R1 of the thick film R' into a state of being soluble in the developing solution as illustrated in FIG. 9(C). Specifically, polymers located in the upper portion of thick film R' are deprotected with the ultraviolet ray, more specifically, protecting groups are changed by the ultraviolet ray into the development soluble polar groups with which the polymers become soluble in the developing solution.

Then, the wafer W is transferred to the thermal treatment apparatus 40 and subjected to a thermal treatment. The thermal treatment accelerates modification of the upper portion R1 of the thick film R', namely, the deprotection of the polymers in the upper portion of the thick film R'.

The wafer W is then transferred to the other developing treatment apparatus 33 and subjected to a developing treatment, and a modified portion in the upper portion of the thick film R' is removed as illustrated in FIG. 9(C) and FIG. 9(D), whereby the resist film R having the target film thickness is formed. The deprotection by the above-described ultraviolet irradiation processing proceeds uniformly within the plane of the wafer W. Therefore, the resist film R before the ultraviolet irradiation processing, namely, the thick film R' is uniform in film thickness within the plane and is small in depth of the projections and recesses on its surface, so that the resist film R having the target film thickness after the ultraviolet irradiation processing and the developing treatment becomes uniform in film thickness within the plane and becomes small in depth of the projections and recesses on its surface, namely, becomes flat.

Note that the amount of removing by the removing treatment of the upper portion R1 of the thick film R' can be adjusted by the irradiation amount of the ultraviolet ray.

The wafer W is then transferred to the exposure apparatus 4 and subjected to exposure processing in a predetermined pattern.

The wafer W is then transferred to the thermal treatment apparatus 40 and subjected to a post-exposure baking treatment. The wafer W is then transferred to the developing treatment apparatus 30 and subjected to a developing treatment. After the developing treatment is finished, the wafer W is transferred to the thermal treatment apparatus 40 and subjected to a post-baking treatment. The wafer W is then transferred to the cassette C on the mounting plate 13, with which the substrate treatment in the substrate treatment system 1 is completed.

In this embodiment, the resist film having the target film thickness and being uniform within the plane can be formed on the wafer having the projections and recesses, in which the projecting portion and the recessed portion are large in width and the recessed portion is low in aspect ratio, formed on its surface. Further, also in this embodiment, the resist film small in depth of the projections and recesses on the surface of the resist film and substantially the same in film thickness at both ends in the diameter direction on the recessed portion of the wafer W can be formed.

Figure 16:
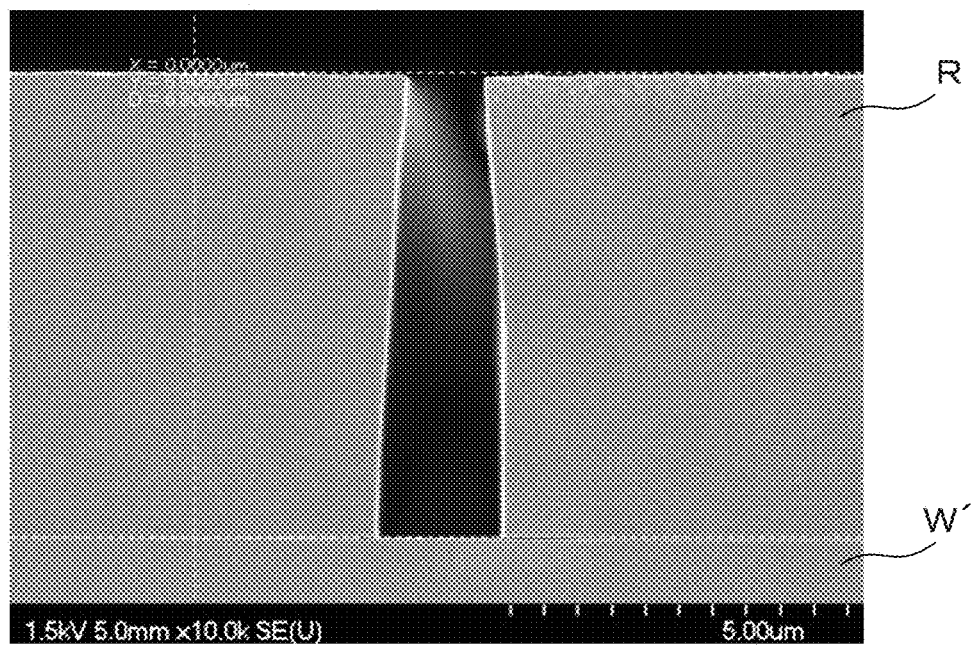
FIG. 16 is a view illustrating a result of a test of confirming whether or not a pattern formation by pattern exposure and development can be performed even on a resist film after a removing treatment using an ultraviolet ray and a developing solution.

(Confirmation Test) FIG. 16 is a view illustrating a result of a test of confirming whether or not a pattern formation by pattern exposure and development can be performed even on a resist film after the removing treatment using the ultraviolet ray and the developing solution, and illustrates a cross section of the resist film R after pattern formation.

In the confirmation test, a resist film R' of 9.5 μm was formed on a bare silicon wafer W' and the resist film was etched back down to 6 μm with the ultraviolet irradiation and the developing solution, and then the pattern exposure and the developing treatment were performed so as to form a trench pattern having a remaining width of 5 μm and a void interval of 1 μm. Note that the resist solution used was a KrF resist having a viscosity of 171 cP and its application amount was 6.0 ml. Further, cyclohexane was used as a prewet thinner in forming the resist film. Further, the irradiation amount of the ultraviolet ray was set to 20 J/m².

In the confirmation test, the trench pattern in an excellent shape was able to be formed in the resist film as illustrated in FIG. 16.

This confirmation test is for the resist film on the bare silicon wafer W', namely, a wafer' having a flat surface, and it is conceivable that the similar result can be obtained even on a wafer having the projections and recesses in which the projecting portion and the recessed portion are large in width and the recessed portion is low in aspect ratio.

Note that the other developing treatment apparatus 33 used for etching back is provided in the treatment station 3 in the above description, but may be provided in the interface station 5 in a case where there is no space in the treatment station 3 or the like.

The film thickness of the thick film R' was set to equal to or more than 1.5 times, preferably 1.8 times the target film thickness of the resist film R in the above description. Further, the film thickness of the thick film R' is preferably set to equal to or more than 1.5 times, preferably 1.8 times the depth of the projections and recesses of the wafer W.

Further, the wafer to be formed with a resist film in the above embodiment is a wafer satisfying the following conditions. Specifically, the wafer has projections and recesses in which an aspect ratio being the ratio of the depth of the recessed portion to the width of the recessed portion of the projections and recesses is 0.0002 to 0.8. When this wafer has a depth of the recessed portion of 1 to 8 μm and a width of the projecting portion and the recessed portion of the projections and recesses of 10 to 5000 μm, the film thickness of the resist film becomes nonuniform within the plane of the wafer in the conventional general method, whereas a film uniform within the plane of the wafer can be obtained according to this embodiment.

The technique according to this disclosure is useful in a technique of forming a coating film such as a resist film or the like on a wafer having projections and recesses, in which the projecting portion has a height of several micrometers, the projecting portion and the recessed portion are large in width, and the recessed portion is low in aspect ratio, formed on its surface.

It should be considered that embodiments disclosed herein are examples only in all respects and are not restrictive. The above embodiments may be simplified, substituted and modified in various forms without departing from the attached scope of claims and the spirit thereof.

What is claimed is:

1. A film forming method for forming a resist film by applying a resist solution onto a substrate having projections and recesses formed on a surface thereof by a predetermined pattern, the film forming method comprising:
   providing a substrate having projections and recesses;
   applying the resist solution onto the surface of the substrate to form a thick film having a depth of projections and recesses on a surface of the film of a predetermined value or less and having a film thickness larger than a target film thickness of the resist film, wherein the projections and recesses of the thick film are arranged to correspond to the projections and recesses on the surface of the substrate before formation of the thick film, wherein a depth of projections and recesses on the surface of the thick film is smaller than the depth of projections and recesses on the surface of the substrate to be formed with the resist film; and subsequently
   after modifying the surface of the thick film into a state of being soluble, removing the soluble surface of the thick film to form the resist film having the target film thickness.

2. The film forming method according to claim 1, wherein the film thickness of the thick film is equal to or more than 1.5 times the target film thickness of the resist film.

3. The film forming method according to claim 2, wherein the film thickness of the thick film is equal to or more than 1.8 times the target film thickness of the resist film.

4. The film forming method according to claim 1, wherein an aspect ratio of the projections and recesses on the substrate to be formed with the resist film is a ratio of a depth of a recessed portion of the projections and recesses to a width of the recessed portion and is 0.0002 to 0.8, and a depth of the recessed portion is 1 to 8 μm.

5. The film forming method according to claim 1, wherein the removing the surface of the thick film includes applying an acid to the surface of the thick film or irradiating the surface of the thick film with an ultraviolet ray to modify the surface of the thick film, and thereafter developing the thick film to remove the surface of the thick film and form the resist film having the target film thickness.

* * * * *